(12) United States Patent
Ueda et al.

(10) Patent No.: US 7,738,525 B2
(45) Date of Patent: Jun. 15, 2010

(54) SEMICONDUCTOR LASER AND METHOD FOR FABRICATING THE SAME

(75) Inventors: Daisuke Ueda, Osaka (JP); Masaaki Yuri, Osaka (JP); Yoshiaki Hasegawa, Shiga (JP); Kenichi Matsuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 307 days.

(21) Appl. No.: 12/065,991

(22) PCT Filed: Jul. 9, 2007

(86) PCT No.: PCT/JP2007/063681

§ 371 (c)(1),
(2), (4) Date: Mar. 6, 2008

(87) PCT Pub. No.: WO2008/015882

PCT Pub. Date: Feb. 7, 2008

(65) Prior Publication Data

US 2009/0135875 A1  May 28, 2009

(30) Foreign Application Priority Data

Jul. 31, 2006  (JP) .............................. 2006-208938

(51) Int. Cl.
*H01S 5/00* (2006.01)
(52) U.S. Cl. ..................... 372/49.01; 438/33
(58) Field of Classification Search ............ 257/98, 257/643; 385/32; 372/49.01, 46.015
See application file for complete search history.

(56) References Cited

U.S. PATENT DOCUMENTS

| 4,980,020 | A | * | 12/1990 | Douglas | ..................... 438/648 |
| 5,059,552 | A | * | 10/1991 | Harder et al. | ................. 438/40 |
| 7,115,908 | B2 | | 10/2006 | Watanabe et al. | |
| 7,356,060 | B2 | * | 4/2008 | Mochida | ................... 372/43.01 |
| 2005/0281304 | A1 | * | 12/2005 | Mochida | ................... 372/46.01 |

FOREIGN PATENT DOCUMENTS

| JP | 2001-135895 | 5/2001 |
| JP | 2001-185809 | 7/2001 |
| JP | 2001-185810 | 7/2001 |
| JP | 2001-203423 | 7/2001 |
| JP | 2002-237648 | 8/2002 |
| JP | 2002-305353 | 10/2002 |
| JP | 2003-031894 | 1/2003 |
| JP | 2003-060298 | 2/2003 |
| JP | 2005-217415 | 8/2005 |

* cited by examiner

*Primary Examiner*—Minsun Harvey
*Assistant Examiner*—Tuan N. Nguyen
(74) *Attorney, Agent, or Firm*—McDermott Will & Emery LLP

(57) ABSTRACT

A semiconductor laser (101) includes a first cladding layer (103), an active layer (105) and a second cladding layer (108). A window region (115) including fluorine, that is, an impurity element with higher electronegativity than nitrogen, is formed in the vicinity of a front end face (113) and a rear end face (114) of a laser resonator. The window region (115) is formed by exposing the front end face (113) and the rear end face (114) to carbon fluoride ($CF_4$) plasma. The effective band gap of a portion of the active layer (105) disposed in the window region (115) is larger than the effective band gap of another portion of the active layer, and hence, it functions as an end face window structure for suppressing COD.

13 Claims, 10 Drawing Sheets

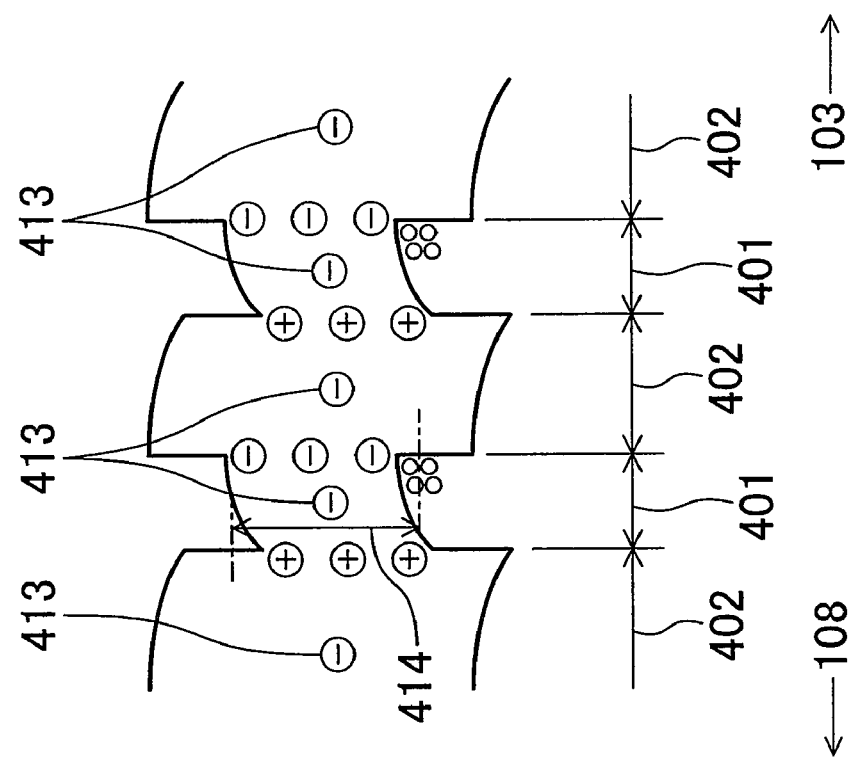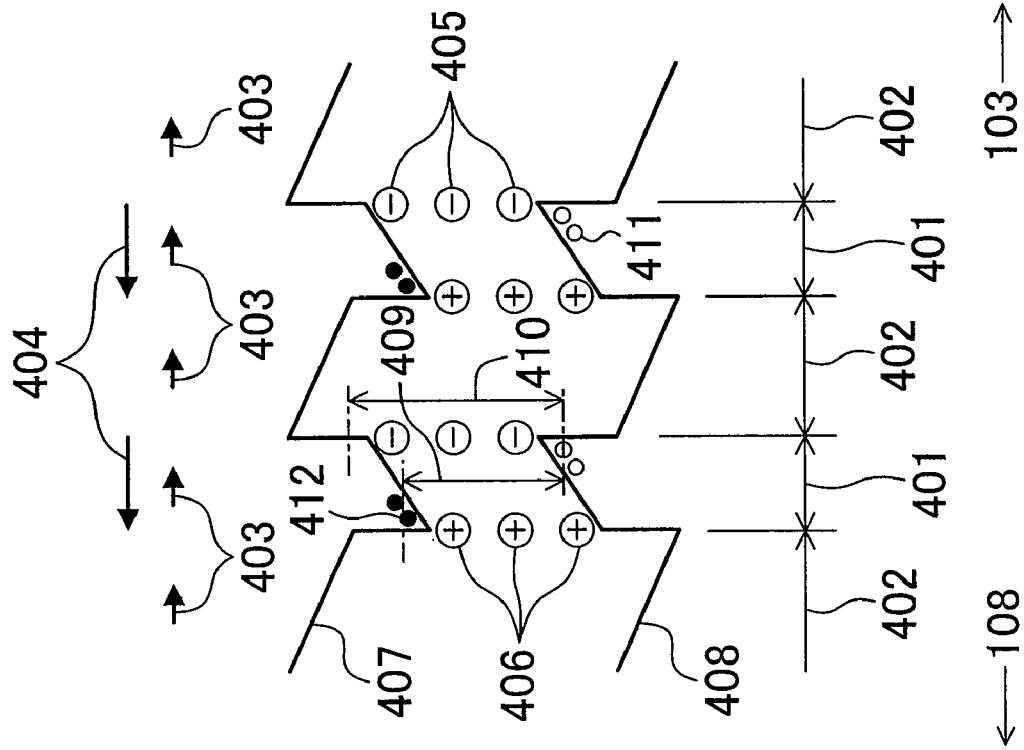

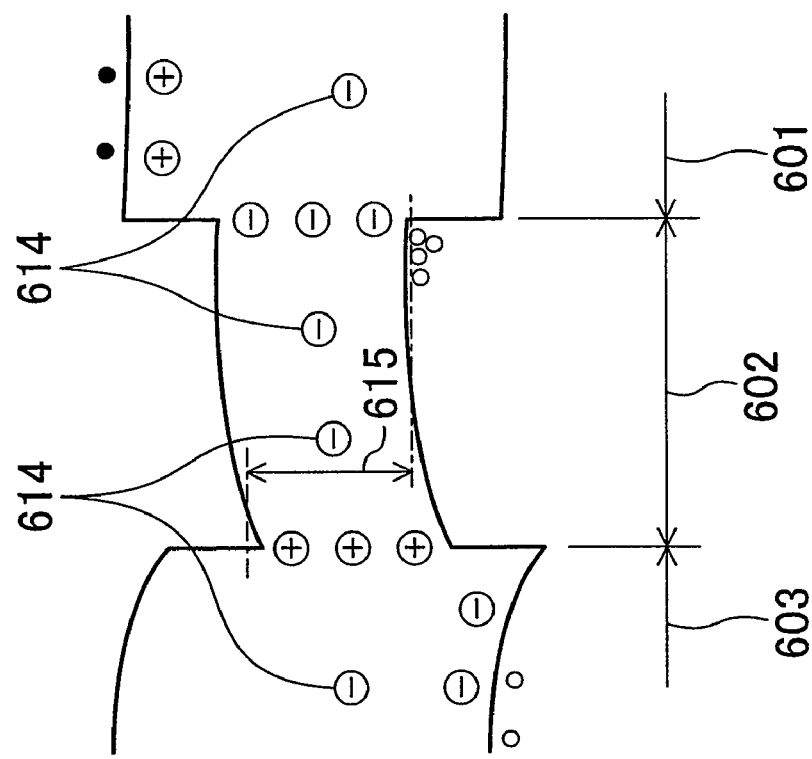
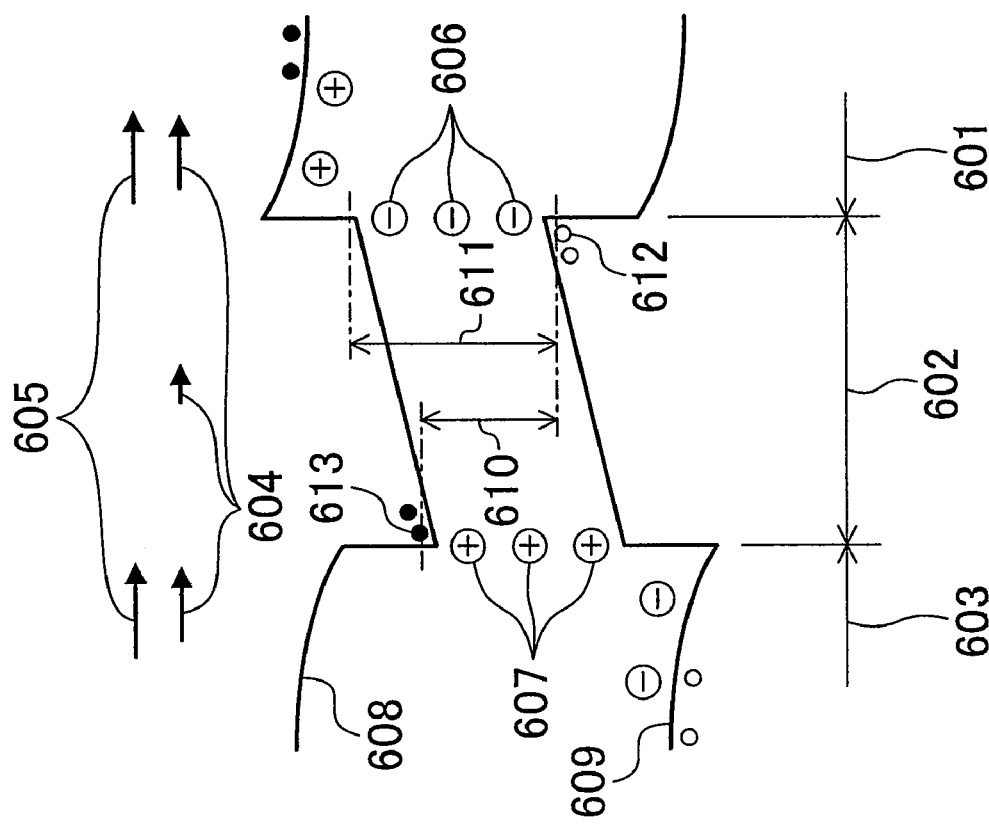

SEMICONDUCTOR LASER AND METHOD FOR FABRICATING THE SAME

RELATED APPLICATIONS

This application is the U.S. National Phase under 35 U.S.C. §371 of International Application No. PCT/JP2007/063681, filed on Jul. 9, 2007, which in turn claims the benefit of Japanese Application No. 2006-208938, filed on Jul. 31, 2006, the disclosures of which Applications are incorporated by reference herein.

TECHNICAL FIELD

The present invention relates to a nitride semiconductor laser lasing at a wavelength ranging from a blue to UV region and used in an optical pickup or a solid-state lighting device and a method for fabricating the same, and more particularly, it relates to a surface treatment technique for a resonator end face for suppressing catastrophic optical damage.

BACKGROUND ART

A semiconductor laser included in an optical pickup used in reproducing/recording an optical disk attains a higher recording density in the optical disk as the lasing wavelength is shorter. Therefore, a nitride semiconductor laser lasing at a wavelength ranging from a blue to violet region has been developed, and an optical pickup using such a nitride semiconductor laser has been put to practical use. Also, application of a nitride semiconductor laser lasing at a wavelength of the UV region to a solid-state lighting device in which a fluorescent material is excited with UV has been examined, and such a solid-state lighting device is expected to take the place of a fluorescent lamp.

It is known that catastrophic optical damage (COD) is caused on a resonator end face in such a nitride semiconductor laser and thus prevents the laser from attaining high output in the same manner as in a conventional AlGaAs-based infrared semiconductor laser or a conventional AlGaInP-based red semiconductor laser. The COD is phenomenon that a resonator end face is damaged through a positive feedback function as follows: Non-radiative recombination of electron-hole pairs is caused in a larger amount in the vicinity of the end face where interface state density is higher than in the inside of the resonator, the temperature is increased by the non-radiative recombination so as to reduce the band gap and cause light absorption, and the light absorption further increases the temperature.

In the conventional infrared or red semiconductor laser, in order to prevent the occurrence of the COD, an impurity is diffused in a portion of a multiple quantum well active layer disposed in the vicinity of a resonator end face for disordering a well layer and a barrier layer, and thus, a window structure in which the band gap of the active layer is larger merely in the vicinity of the end face is employed. In a nitride semiconductor, however, it is difficult to disorder a multiple quantum well, and hence, the window structure is difficult to obtain in the aforementioned manner. As an alternative method for forming the window structure, a method in which a nitride semiconductor layer with a large band gap is previously buried through crystal growth in a portion corresponding to an end face so as to obtain an end face window structure by cleaving this portion is disclosed (see Patent Document 1).

Alternatively, instead of forming the window structure, the COD may be suppressed by preventing a current from being injected into a portion in the vicinity of an end face. With respect to a nitride semiconductor laser, a technique in which an impurity is introduced into a portion in the vicinity of a resonator end face for increasing the resistance so as to prevent a current from passing the portion (see Patent Document 2) and a technique in which a Schottky electrode is formed instead of an ohmic electrode in the vicinity of a resonator end face for preventing injection of a current (see Patent Document 3) are disclosed. Now, the technique disclosed in Patent Document 2 will be simply described with reference to a drawing.

In the fabrication of a semiconductor laser having an ultimate structure shown in FIG. 10, an n-type contact layer 1002 of GaN, an n-type cladding layer 1003 of AlGaN, a multiple quantum well active layer 1004, a p-type cladding layer 1005 of AlGaN and a p-type contact layer 1006 of GaN are successively formed on a sapphire substrate 1001. Si is used as an n-type dopant for the n-type contact layer 1002 and the n-type cladding layer 1003, and Mg is used as a p-type dopant for the p-type cladding layer 1005 and the p-type contact layer 1006. Next, a ZnO film is formed on the p-type contact layer 1006 merely in the vicinity of a resonator end face, and annealing is performed with a thermal diffusion furnace. Thus, Zn included in the ZnO film is thermally diffused downward so as to be introduced through the p-type contact layer 1006 into the p-type cladding layer 1005, the active layer 1004 and even a part of the n-type cladding layer 1003. As a result, a high-resistance region 1007 is formed in the vicinity of the resonator end face.

After removing the ZnO film, a ridge is formed from a projected portion of the p-type cladding layer 1005 and the p-type contact layer 1006, and a $SiO_2$ current blocking layer 1008 having an opening on a portion of the p-type contact layer 1006 excluding the high-resistance region 1007 and on a part of the n-type contact layer 1002 is formed. Thereafter, a p-side pad electrode 1009 is formed on a p-side ohmic electrode (not shown), and an n-side pad electrode 1011 is formed on an n-side ohmic electrode 1010, resulting in completing the semiconductor laser shown in FIG. 10. This semiconductor laser has an advantage that the COD is minimally caused because no current is injected into the high-resistance region 1007 formed in the vicinity of the resonator end face.

Patent Document 1: Japanese Laid-Open Patent Publication No. 2003-60298

Patent Document 2: Japanese Laid-Open Patent Publication No. 2002-305353

Patent Document 3: Japanese Laid-Open Patent Publication No. 2003-31894

Patent Document 4: Japanese Laid-Open Patent Publication No. 2005-217415

DISCLOSURE OF THE INVENTION

Problems to be Solved by the Invention

In any of the conventional methods for suppressing the COD, the suppressing function is realized by partly modifying the structure of a semiconductor laser. Such modification of the structure requires additional processing accompanied with an additionally used photomask, and hence, it is apprehended that the yield may be lowered and that the fabrication cost may be increased. In particular, the cost is largely increased when a crystal growth process is additionally performed for forming a window structure. Furthermore, in the structure in which a region where no current is injected is provided in the vicinity of a resonator end face, the effect to suppress the COD cannot be attained if the region is too small, and if the region is too large on the contrary, the region works as a saturable absorber, which causes discontinuity in the current-optical output characteristic of the resultant semiconductor laser.

A problem to be solved by the present invention is suppressing the COD of a nitride semiconductor laser without lowering the yield or increasing the fabrication cost and without affecting other electric/optical characteristics. For this purpose, a novel nitride semiconductor laser having an effective window structure formed without modifying the basic structure thereof and a method for fabricating the same are provided. Furthermore, the present invention is devised on the basis of a physical property of a strong polarization characteristic peculiar to a nitride semiconductor, and hence, the effect is minimally exhibited in a conventional infrared or red semiconductor laser. However, when a semiconductor laser made of a novel material with a strong polarization characteristic is put to practical use, the invention is applicable to this novel semiconductor laser.

Means for Solving the Problem

In order to achieve the object, the semiconductor laser of this invention includes a substrate; a first cladding layer made of a nitride semiconductor of a first conductivity type and formed on the substrate; an active layer made of a single-layered or multi-layered nitride semiconductor and formed on the first cladding layer; and a second cladding layer made of a nitride semiconductor of a second conductivity type and formed on the active layer, and an impurity element with higher electronegativity than nitrogen is included in at least one region that contains a portion of the active layer disposed in the vicinity of an end face along a resonator direction.

First, a nitride semiconductor has a strong polarization characteristic derived from spontaneous polarization and piezoelectric polarization. The magnitude of the polarization is different between, for example, a GaN active layer and an AlGaN cladding layer, and therefore, sheet fixed charge is generated on the interface therebetween. Since an internal field is formed in the GaN active layer by the sheet fixed charge and a conduction band and a valence band shown in an energy band diagram are inclined, the effective band gap is reduced as compared with the case where the internal field is not formed. This knowledge is disclosed in, for example, Patent Document 4.

On the contrary, novel finding obtained by the present inventors is as follows: When an impurity element with higher electronegativity than nitrogen is introduced into an active layer, the impurity element works as an electron trap, which captures an electron or newly generates a hole so as to generate negative distributed fixed charge. Therefore, the inclination of the conduction band and the valence band is relaxed. Thus, the impurity element works to restore the reduced band gap of the active layer. In other words, when an impurity element with higher electronegativity than nitrogen is introduced into a portion in the vicinity of a resonator end face, the band gap of an active layer can be increased merely in the vicinity of the end face, and thus, a substantial window structure is formed. It is well known that a window structure has an effect to suppress the COD, and the occurrence of the COD can be suppressed by this structure.

The active layer may have a multiple quantum well structure.

In the case where the active layer has a multiple quantum well structure, sheet fixed charge is generated also on the interface between, for example, an InGaN well layer and a GaN barrier layer. The effective band gap of the well layer is reduced by the sheet fixed charge, but when an impurity element with higher electronegativity than nitrogen is introduced into the portion in the vicinity of the resonator end face, the band gap of the well layer is restored merely in the vicinity of the end face. Thus, a substantial window structure is formed. Even when the active layer is made of a bulk or a multiple quantum well, a substantial window structure can be formed by introducing an impurity element with high electronegativity. However, the effect is more remarkably exhibited in the multiple quantum well structure because the inclination of the conduction band and the valence band caused by the polarization is larger.

The impurity element may be fluorine.

Fluorine has the highest electronegativity among all the elements included in the periodic table and exhibits the most remarkable effect to relax the polarization.

A content of the fluorine may be $10^{18}$ cm$^{-3}$ or more in the end face.

The amount of the sheet fixed charge generated by the polarization is disclosed in, for example, Patent Document 4, and in order to cancel this charge, it is effective to include fluorine in a concentration of $10^{18}$ cm$^{-3}$ or more.

The semiconductor laser may further include a protection film made of a nitride insulator and formed on the end face.

The impurity element introduced through the end face may sometimes dissipated outside through thermal hysteresis or aging after the introduction. In order to prevent this, it is effective to use a nitride insulator such as SiN or AlN as a passivation film.

The method for fabricating a semiconductor laser of this invention includes the steps of forming, on a substrate, a first cladding layer made of a nitride semiconductor of a first conductivity type; forming, on the first cladding layer, an active layer made of a single-layered or multi-layered nitride semiconductor; forming, on the active layer, a second cladding layer made of a nitride semiconductor of a second conductivity type; exposing both end faces along a resonator direction by cleaving the substrate; and performing an end face treatment for introducing an impurity element with higher electronegativity than nitrogen through at least one end face of the both end faces.

By this fabrication method, a semiconductor laser including an impurity element with higher electronegativity than nitrogen in the vicinity of a resonator end face can be fabricated. As a feature of this fabrication method, the impurity element is introduced in the end face treatment performed in what is called a bar state, namely, after completing wafer processing of the semiconductor laser fabrication and after cleaving a wafer for forming a resonator end face. In the general fabrication method, coating is provided in the bar state for controlling the reflectivity of the resonator end face and protecting the end face. The end face treatment for introducing the impurity element can be performed easily prior to this coating without largely increasing the number of procedures.

The impurity element may be introduced through both end faces or one end face of the resonator. In general, a semiconductor laser is provided with coating so as to attain a high output from a front end face and a low output from a rear end face, and the optical power density within the resonator is higher on the rear end face. Accordingly, the COD suppressing effect can be largely exhibited even when the end face treatment is performed on the rear end face alone. In the case where it is necessary to perform the end face treatment twice on the front end face and the rear end face, the number of procedures can be reduced by performing the end face treatment on the rear end face alone.

The impurity element may be fluorine.

As described above, fluorine has the highest electronegativity among all the elements included in the periodic table and exhibits the most remarkable effect to relax the polarization.

Furthermore, the both end faces or the one end face may be exposed to plasma generated by using a material gas including the impurity element in the end face treatment.

The plasma generated by using the material gas including the impurity element includes ions and radicals of the impurity element, and the impurity element is introduced into a portion in the vicinity of the end face by exposing the resonator end face to this plasma.

Furthermore, the material gas may include, as a principal component, one gas selected from the group consisting of fluorine, carbon fluoride, sulfur fluoride, nitrogen fluoride and silicon fluoride.

In the case where fluorine is used as the impurity element, the material gas is preferably fluorine ($F_2$), carbon fluoride ($CF_4$), sulfur fluoride ($SF_6$, $S_2F_2$), nitrogen fluoride ($NF_3$) or silicon fluoride ($SiF_4$). Such a material gas is widely used in the semiconductor process such as reactive ion etching, and a technique and an apparatus for generating plasma have been already established. Furthermore, since a nitride semiconductor is minimally etched through the reactive ion etching using such a material gas, the end face treatment can be performed by directly using a reactive ion etching system.

The method for fabricating a semiconductor laser may further include a protection film depositing step performed continuously with the end face treatment in a vacuum system used in the end face treatment.

In order to suppress the dissipation of the impurity element introduced in the end face treatment, it is effective to form a protection film made of, for example, a nitride insulator. When a protection film is deposited continuously in a vacuum system used in the end face treatment, the effect is more remarkably exhibited. Most of systems for depositing an insulator such as a plasma CVD system have a plasma etching function for cleaning an insulating material deposited on the inner wall of the system, and when such a system is used, the end face treatment for exposing the end face to the plasma and the protection film deposition can be easily continuously performed.

The impurity element may be ion implanted into the both end faces or the one end face in the end face treatment.

As compared with the end face treatment performed by using the reactive ion etching system, the fabrication cost is higher, but when the impurity element is ion implanted, the amount of element to be introduced and the introducing depth can be accurately controlled.

The both end faces or the one end face may be exposed to a material gas including the impurity element and the material gas is irradiated with UV in the end face treatment.

Apart from the plasma activation, the material gas can be decomposed for activation by irradiating with UV. Although it is apprehended that the resonator end face may be damaged when exposed to the plasma in the plasma activation, such a problem can be avoided in UV activation.

The both end faces or the one end face may be exposed to a material gas including the impurity element and the material gas is heated in the end face treatment. In particular in this case, the material gas may include, as a principal component, xenon fluoride or fluorine chloride.

The material gas can be decomposed through heating instead of the UV irradiation. In this case, the material gas is preferably easily decomposed through heating, and xenon fluoride ($XeF_2$) or fluorine chloride ($FCl_3$) is suitably used as the material gas.

The both end faces or the one end face may be immersed in a solution including the impurity element in the form of ions in the end face treatment.

As a simpler end face treatment not requiring a vacuum system, wet processing can be performed. When a resonator end face is immersed in a solution including, in the form of ions, the impurity element with higher electronegativity than nitrogen, the impurity element is introduced into the portion in the vicinity of the end face.

An electric field may be applied to the solution with the both end faces or the one end face used as an anode in the end face treatment.

Since an element with high electronegativity becomes an anion, when an electric field is applied with a resonator end face used as an anode, the impurity element can be more positively introduced into the portion in the vicinity of the end face.

The solution may be an ammonium fluoride aqueous solution.

In the case where fluorine is used as the impurity element, an ammonium fluoride aqueous solution is suitably used as the solution for the wet processing. Since an ammonium fluoride aqueous solution is widely used in the semiconductor process, one with high impurity can be easily obtained. Furthermore, since it minimally etches a nitride semiconductor, an insulating film and an electrode metal included in a semiconductor laser in the bar state, there is no need to cover a portion other than the end face for protection in the end face treatment, and thus, the end face treatment can be simplified.

EFFECT OF THE INVENTION

According to the semiconductor laser of this invention, a nitride semiconductor laser having a substantial window structure formed without modifying the basic structure thereof can be realized, and therefore, the COD can be suppressed in the nitride semiconductor laser without affecting other electric/optical characteristics. Also, in the fabrication method for the semiconductor laser, processing generally employed in the semiconductor process is merely additionally performed on a resonator end face as the end face treatment, and therefore, the nitride semiconductor laser in which the COD is suppressed can be fabricated without lowering the yield and increasing the fabrication cost.

BRIEF DESCRIPTION OF DRAWINGS

FIGS. 4A and 4B are diagrams for showing energy bands of the semiconductor laser of Embodiment 1 of the invention.

FIGS. 6A and 6B are diagrams for showing energy bands of a semiconductor laser according to Embodiment 2 of the invention.

Figure 1:
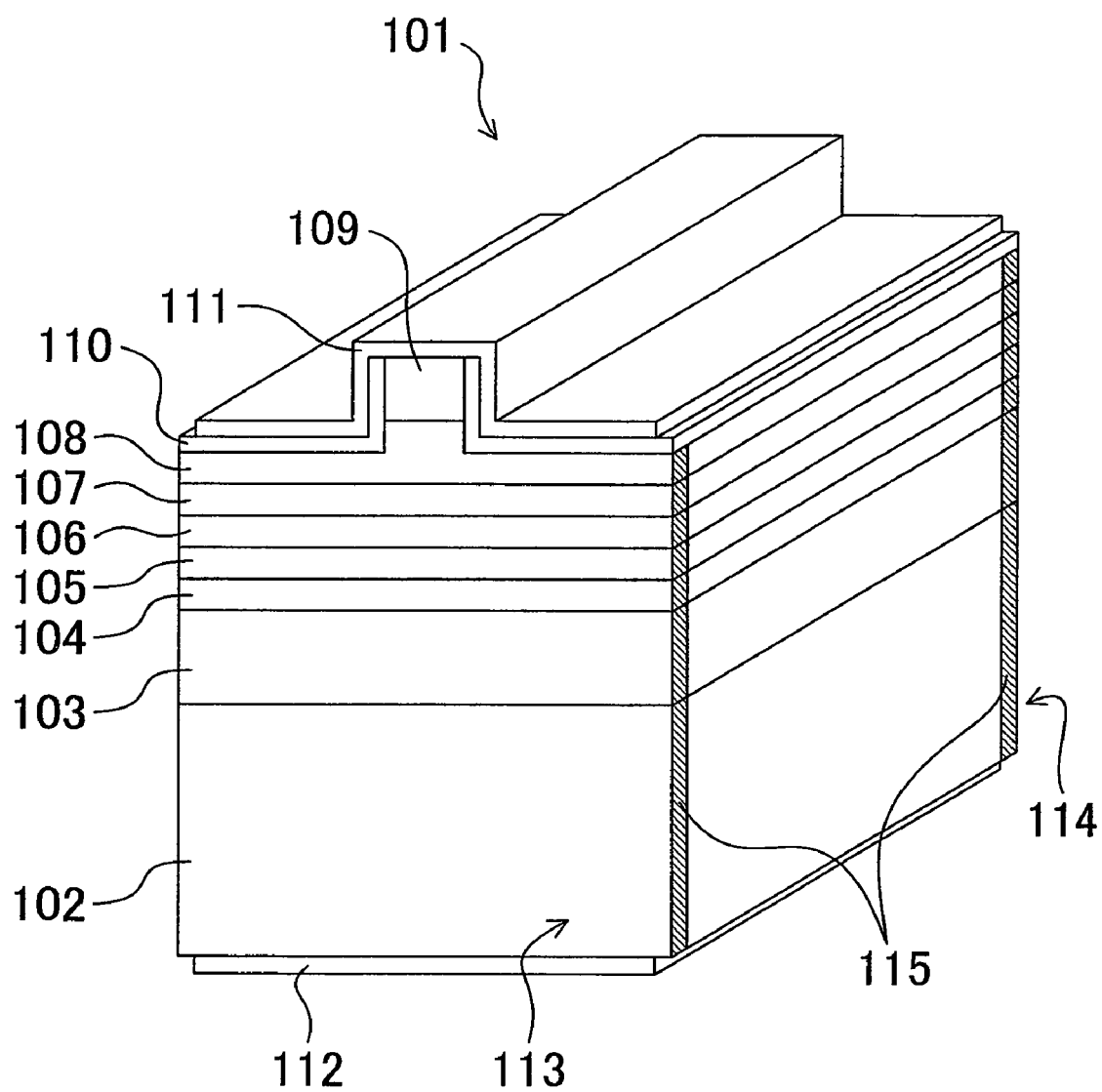
FIG. 1 is a perspective view of a semiconductor laser according to Embodiment 1 of the invention.

DESCRIPTION OF REFERENCE NUMERALS 101 semiconductor laser
102 GaN substrate
103, 601 first cladding layer
104 first guiding layer
105, 602 active layer
106 second guiding layer
107 overflow suppressing layer
108, 603 second cladding layer
109 contact layer
110 insulating film
111 p-side electrode
112 n-side electrode
113 front end face
114 rear end face
115 window region
301 abrupt increase of driving current
401 InGaN well layer
402 GaN barrier layer
403, 604 spontaneous polarization
404, 605 piezoelectric polarization
405, 606 negative fixed sheet charge
406, 607 positive fixed sheet charge
407, 608 conduction band
408, 609 valence band
409, 610 inclined band gap
410, 611 field-free band gap
411, 612 hole
412, 613 electron
413, 614 negative fixed distributed charge
414, 615 band gap
501 RIE system
502, 802 susceptor
503 upper electrode
504, 804 vacuum exhausting line
505, 805 gas introducing line
506, 806, 903 bar
507, 807, 904 supporting jig
508, 808 one end face
509, 809 chamber
510 $CF_4$ plasma
801 UV apparatus
803 UV lamp (or infrared lamp)
810 UV
901 aqueous solution
902 resonator end face
905 cathode

BEST MODE FOR CARRYING OUT THE INVENTION

Preferred embodiments of the invention will now be described with reference to the accompanying drawings.

Embodiment 1

FIG. 1 is a perspective view of a semiconductor laser according to Embodiment 1 of the invention. The semiconductor laser 101 has an epitaxial layer structure in which a first cladding layer 103 made of Si-doped n-type (first conductivity type) $Al_{0.05}Ga_{0.95}N$ (with a thickness of 1 μm and a carrier concentration of $5\times10^{17}$ $cm^{-3}$), a first guiding layer 104 made of Si-doped n-type GaN (with a thickness of 100 nm and a carrier concentration of $5\times10^{17}$ $cm^{-3}$), an active layer 105 of a multiple quantum well of a non-doped $In_{0.08}Ga_{0.92}N$ well layer (with a thickness of 3 nm) and a GaN barrier layer (with a thickness of 8 nm), a second guiding layer 106 made of non-doped GaN (with a thickness of 100 nm), an overflow suppressing layer 107 made of Mg-doped p-type (second conductivity type) $Al_{0.15}Ga_{0.85}N$ (with a thickness of 10 nm and a carrier concentration of $1\times10^{19}$ $cm^{-3}$), a second cladding layer 108 made of Mg-doped p-type $Al_{0.1}Ga_{0.9}N$/GaN superlattice (with a thickness of 500 nm) and a contact layer 109 made of Mg-doped p-type GaN (with a thickness of 60 nm and a carrier concentration of $1\times10^{20}$ $cm^{-3}$) are successively stacked on an n-type GaN substrate 102.

The contact layer 109 and a part of the second cladding layer 108 are etched so as to form a ridge in the shape of a stripe. An insulating film 110 of $SiO_2$ is formed thereon, and a p-side electrode 111 made of Pd/Pt is further formed thereon. The insulating film 110 has an opening on the ridge, and the p-side electrode 111 is in contact with the contact layer 109 through this opening. Also, an n-side electrode 112 made of Ti/Pt/Au is formed on the bottom surface of the GaN substrate 102. Although not shown in the drawing, a pad including an uppermost layer of Au is preferably formed on the p-side electrode 111 and the n-side electrode 112 for bonding and heat releasing.

Figure 2:
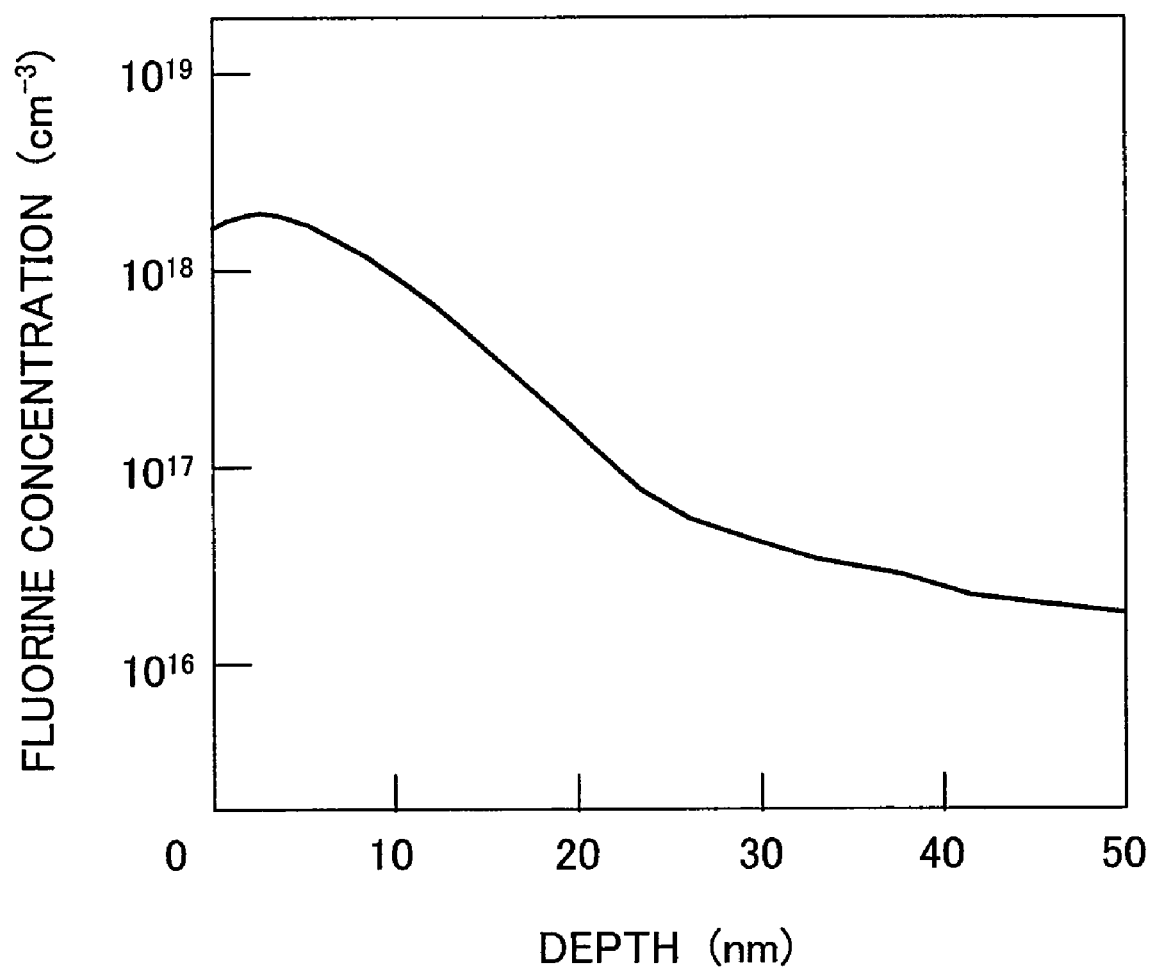
FIG. 2 is a distribution diagram along a depth direction of fluorine included in a window region of the semiconductor laser of Embodiment 1 of the invention.

A window region 115 including fluorine, that is, an impurity element with higher electronegativity than nitrogen, is formed in the vicinity of a front end face 113 of a laser resonator corresponding to the front face in the perspective view and in the vicinity of a rear end face 114 corresponding to the rear face in the perspective view. The window region 115 is formed by exposing the front end face 113 and the rear end face 114 to carbon fluoride ($CF_4$) plasma, which will be described in detail later. The content of fluorine in the window region 115 is shown in FIG. 2. FIG. 2 shows the result of measurement of the fluorine content in the GaN substrate 102 along a depth direction from the end face obtained through secondary ion mass spectrometry (SIMS), and the well layer and the barrier layer of the active layer 105 also include fluorine to the same extent. It is noted that the window region 115 may be formed in the vicinity of the rear end face 114 alone.

Although not shown in the drawing, a protection film made of a nitride insulator such as SiN or AlN may be formed on the front end face 113 and the rear end face 114. A nitride insulator is good at adhesion to a nitride semiconductor included in the semiconductor laser and hence exhibits a remarkable effect as a passivation film for preventing the fluorine introduced into the window region 115 from dissipating outside through heat hysteresis or aging after the introduction. When the thickness of this passivation film is appropriately set, it can function as a coating for controlling the reflectivity on the end face.

Figure 3A:
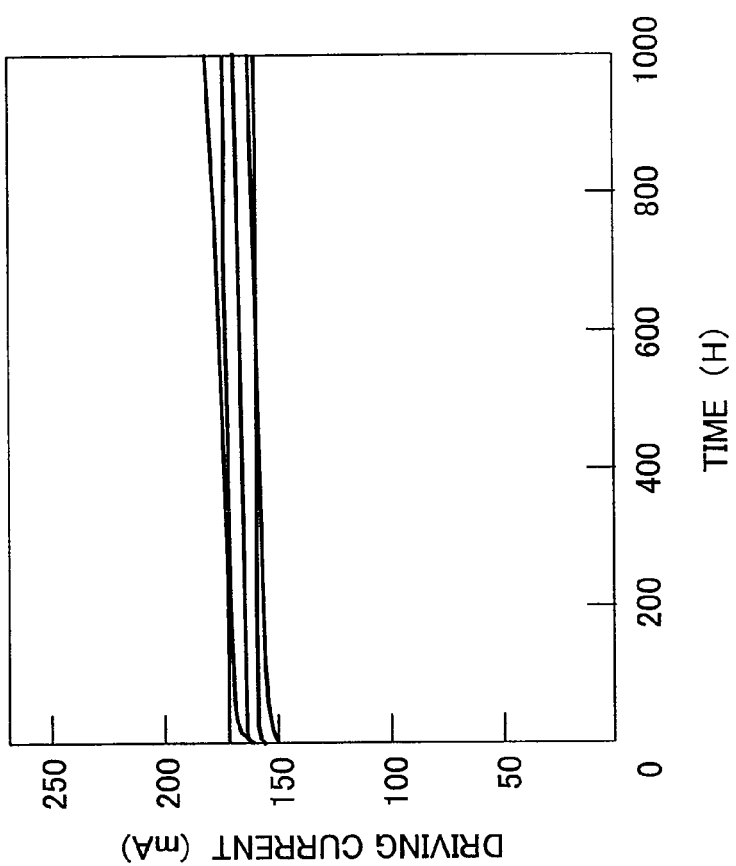
FIGS. 3A and 3B are diagrams for showing an aging characteristic of the semiconductor laser of Embodiment 1 of the invention.
Figure 3B:
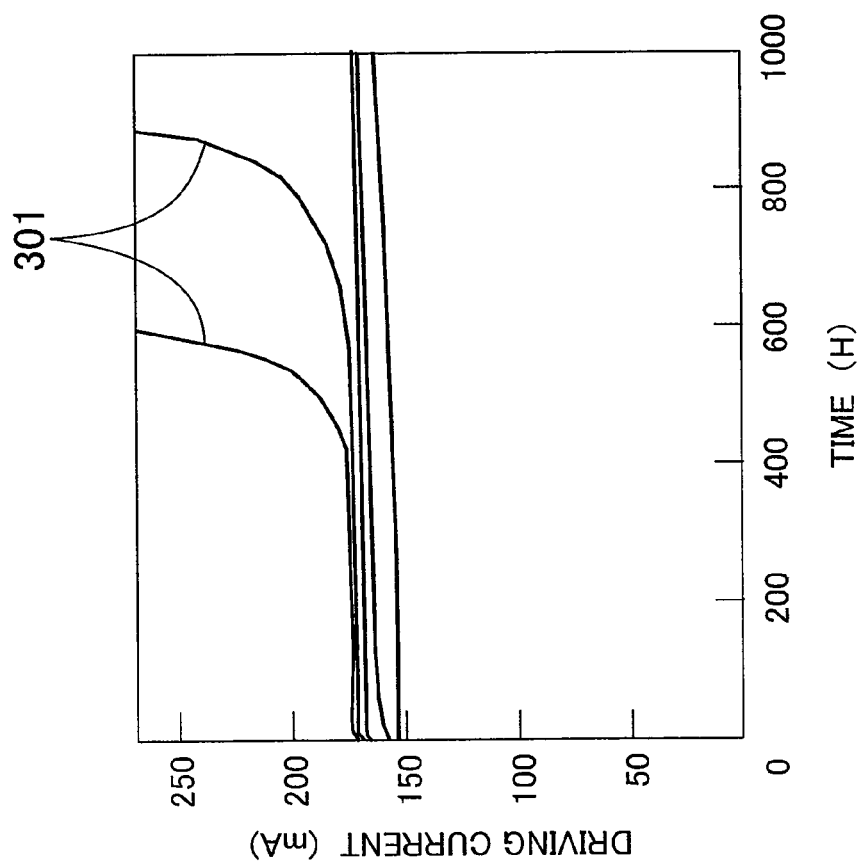

FIGS. 3A and 3B show results of an aging test of the semiconductor laser 101 in which the occurrence of COD is suppressed by the window region 115. In this test, automatic power control (APC) drive with an optical output of 170 mW is performed at an ambient temperature of 70° C., so as to measure change of the driving current with time. FIG. 3A shows the result obtained in samples in which the window region 115 is not formed for comparison, and in two of five samples, abrupt increase 301 of the driving current is caused within 1000 hours. When the sample having such abrupt degradation is observed with its cross-section along the resonator direction exposed with a scanning electron microscope (SEM) and a transmission electron microscope (TEM), it is confirmed that the crystal is damaged in a portion of the active layer on the rear end face. Specifically, the abrupt degradation caused in the sample having no window region 115 is derived from the COD. On the other hand, FIG. 3B shows the result of the same test performed on the semiconductor laser 101 having the window region 115. The abrupt degradation is caused none of five samples in an aging range of 1000 hours, and it is understood that the occurrence of the COD can be suppressed by forming the window region 115.

The mechanism of forming the window region for suppressing the COD by introducing an impurity element with higher electronegativity than nitrogen will now be described with reference to FIGS. 4A and 4B. FIGS. 4A and 4B are energy band diagrams of the well layer 401 and the barrier layer 402 included in the active layer 105, and the right-hand side of the drawing corresponds to the side of the substrate where the first cladding layer is formed and the left-hand side of the drawing corresponds to the side of the top surface where the second cladding layer is formed. Also, FIG. 4A shows a region where the impurity element with higher electronegativity is not introduced and FIG. 4B shows a region where the impurity element with higher electronegativity is introduced. First, general knowledge of a polarization characteristic of a nitride semiconductor will be described with reference to FIG. 4A.

In general, the crystal of a nitride semiconductor is epitaxially grown on the (0001) plane corresponding to a Ga plane along the c-axis direction. In this case, spontaneous polarization 403 from the top surface toward the substrate is caused in both the InGaN well layer 401 and the GaN barrier layer 402, and since compressive stress is caused in the well layer 401, piezoelectric polarization 404 in the reverse direction is also caused. As a result, negative fixed sheet charge 405 is generated at the end of the well layer 401 disposed on the side of the substrate (namely, on the right-hand side in the drawing) and positive fixed sheet charge 406 is generated at the end thereof disposed on the side of the top surface (namely, on the left-hand side in the drawing). Owing to an internal field formed by these fixed sheet charges, conduction bands 407 and valence bands 408 of the well layer 401 and the barrier layer 402 are inclined as shown in the drawing, and an inclined band gap 409 thus obtained is smaller than a primary field-free band gap 410. Also, holes 411 are localized at the end of the well layer 401 disposed on the side of the substrate and electrons 412 are localized at the end thereof disposed on the side of the top surface.

Next, novel finding concerned with the present invention will be described with reference to FIG. 4B. When an impurity element with higher electronegativity than nitrogen such as fluorine is introduced into the well layer 401 and the barrier layer 402, a deep level working as an electron trap is formed. This electron trap captures an electron 412 present in the well layer 401 or newly generates a hole 411 so as to become negative fixed distributed charge 413. This negative fixed distributed charge causes an upward convex bent in each of the conduction bands 407 and the balance bands 408 of the well layer 401 and the barrier layer 402, resulting in a band structure as shown in FIG. 4B. A bent band gap 414 thus obtained is larger than the inclined band gap 409 and is closer to the field-free band gap 410.

As is obvious from the above description, since the effective band gap of the portion of the active layer including the impurity element with high electronegativity (namely, the bent band gap 414) is larger than the effective band gap of another portion of the active layer (namely, the inclined band gap 409), the window region 114 of the semiconductor laser 101 shown in FIG. 1 functions as an end face window structure for suppressing the COD.

The content of the impurity element necessary for substantially causing the bent of the band as shown in FIG. 4B is calculated as follows: The fixed sheet charge amount generated by the polarization on the interface between the $In_{0.08}Ga_{0.92}N$ well layer and the GaN barrier layer is obtained as a sum of a difference in the spontaneous polarization between $In_{0.08}Ga_{0.92}N$ and GaN, namely, $-6.4 \times 10^{-8}$ C/cm$^2$, and the piezoelectric polarization amount of $In_{0.08}Ga_{0.92}N$ calculated based on a lattice constant, an elastic constant and a piezoelectric constant, that is, $8.67 \times 10^{-7}$ C/cm$^2$, and is approximately $8 \times 10^{-7}$ C/cm$^2$. When this charge amount is converted into the concentration of the impurity element distributed in a total thickness of 11 nm of the well layer and the barrier layer, $(8 \times 10^{-7}$ C/cm$^2) \div (1.6 \times 10^{-19}$ C$) \div (11 \times 10^{-7}$ cm$) = 4.5 \times 10^{18}$ cm$^{-3}$. Therefore, in order to substantially cause the bent of the band, the impurity element needs to be included in the concentration of this order, and hence, for attaining the operation and effect of this invention, the impurity element is included preferably in a concentration of $10^{18}$ cm$^{-3}$ or more.

A fabrication method of this embodiment will now be described with reference to FIGS. 1 and 5. In order to fabricate the structure of FIG. 1, a first cladding layer 103, a first guiding layer 104, an active layer 105, a second guiding layer 106, an overflow suppressing layer 107, a second cladding layer 108 and a contact layer 109 are first epitaxially grown on a GaN substrate 102 by metal-organic vapor-phase epitaxy (MOVPE). Next, the contact layer 109 and a part of the second cladding layer 108 are processed into a ridge in the shape of a stripe through reactive ion etching (RIE) using a chlorine-based gas. An insulating film 110 of $SiO_2$ is formed thereon, and an opening is formed on the ridge by etching. Pd and Pt are formed thereon with electron beam evaporation, so as to form a p-side electrode 111. Also, Ti, Pt and Au are evaporated on the rear surface of the GaN substrate 102, so as to form an n-side electrode 112. Furthermore, Au pads are formed on the p-side electrode 111 and the n-side electrode 112 by electroplating.

Figure 5:
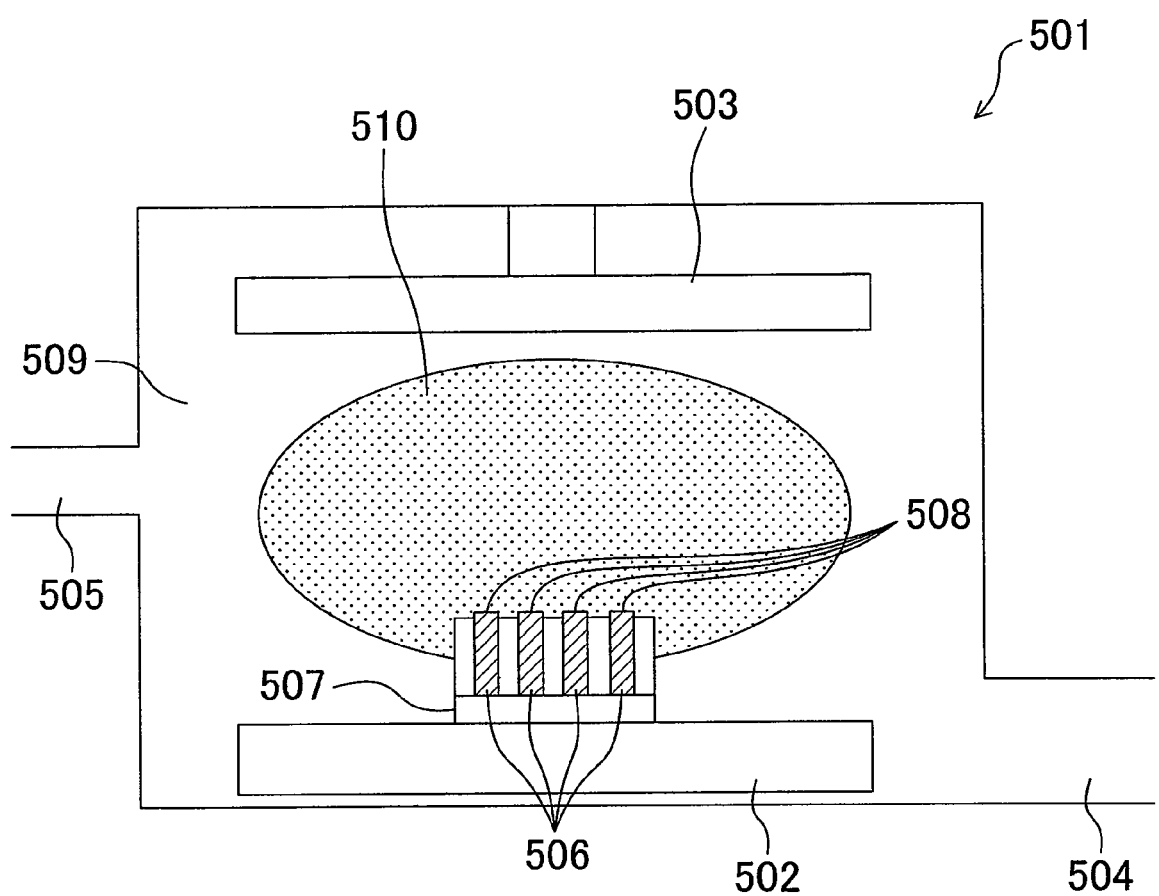
FIG. 5 is a conceptual diagram of an end face treatment performed in a method for fabricating the semiconductor laser of Embodiment 1 of the invention.

A wafer obtained through the aforementioned procedures is processed into a shape of a bar having a resonator end face exposed through cleavage, and the resultant bar is set in an RIE system 501 shown in FIG. 5. The RIE system 501 includes a susceptor 502 also working as a lower electrode, an upper electrode 503, a vacuum exhausting line 504 and a gas introducing line 505. The bar 506 of the semiconductor laser is placed on the susceptor 502 and fixed by a supporting jig 507 with one end face 508 of the resonator facing upward. A chamber 509 of the RIE system 501 is once evacuated to attain high vacuum, a material gas is introduced through the gas introducing line 505, and a pressure within the chamber 509 is kept constant by adjusting the exhausting amount from the vacuum exhausting line 504. The material gas is a gas including an impurity element with higher electronegativity than nitrogen (such as fluorine) and is, for example, a carbon fluoride ($CF_4$) gas. After introducing the material gas, high-frequency power of 150 through 200 W is applied between the susceptor 502 and the upper electrode 503, so as to generate $CF_4$ plasma 510. Thus, the one end face 508 of the resonator is exposed to the $CF_4$ plasma 510. This state is retained for approximately 20 minutes, and thus, an end face treatment for introducing the fluorine element through the one end face 508 of the resonator is completed. After this end face treatment, general coating processing is performed, and the bar is ultimately divided into semiconductor laser chips.

The end face treatment may be performed merely on the rear end face of the semiconductor laser or may be repeated twice for performing on the both end faces. Furthermore, the end face treatment and the coating of the rear end face may be performed after the end face treatment and the coating of the front end face, and thus, the number of procedures for fixing the bar 506 on the supporting jig 507 can be reduced. As an alternative method, the bar 506 may be supported horizontally by the supporting jig 506 so that the both end faces of the resonator can be simultaneously exposed to the $CF_4$ plasma 510. In this case, the both end faces can be simultaneously treated through one end face treatment.

Moreover, a passivation film for suppressing dissipation of the fluorine element having been introduced in the end face treatment may be coated. As such a passivation film, a nitride insulator such as SiN or AlN is suitably used. When the passivation film is deposited continuously within the plasma system used for the end face treatment, the effect is more remarkably exhibited. In this case, a plasma CVD system is preferably used instead of the RIE system. Most of plasma CVD systems have a plasma etching function for cleaning an insulating material deposited on the inner wall of the system, and when such a system is used, the end face treatment for exposing the end face to the plasma and the passivation film deposition can be easily continuously performed.

It is noted that the gas used for generating the plasma in the end face treatment may be, instead of the $CF_4$, fluorine ($F_2$), sulfur fluoride ($SF_6$, $S_2F_2$), nitrogen fluoride ($NF_3$) or silicon fluoride ($SiF_4$), or a gas including another impurity element with higher electronegativity than nitrogen. Furthermore, since the resonator end face may be rather damaged when exposed to the plasma, annealing may be performed after the end face treatment. Specifically, the damage caused by the plasma can be recovered by annealing at 400° C. for 5 minutes with, for example, an RTA (rapid thermal annealing) system.

Embodiment 2

Embodiment 2 of the invention will now be described with reference to FIGS. 6A and 6B. In this embodiment, the active layer 105 of the semiconductor laser 101 shown in FIG. 1 is formed as an undoped GaN bulk (with a thickness of 100 nm) instead of the multiple quantum well. Also, the first guiding layer 104, the second guiding layer 106 and the overflow suppressing layer 107 are not formed. Apart from this, the semiconductor laser of this embodiment has a similar structure to that of Embodiment 1 and is fabricated in a similar fabrication method to that described in Embodiment 1.

Also in this embodiment, a window region for suppressing the COD is formed by introducing an impurity element with higher electronegativity than nitrogen, which will be described with reference to FIGS. 6A and 6B. FIGS. 6A and 6B respectively correspond to FIGS. 4A and 4B mentioned in Embodiment 1, and are energy band diagrams of a first cladding layer 601, an active layer 602 and a second cladding layer 603. FIG. 6A shows a region where the impurity element with high electronegativity is not introduced, and FIG. 6B shows a region where the impurity element with high electronegativity is introduced. First, general knowledge of the polarization characteristic of a three-layered structure composed of an $Al_{0.05}Ga_{0.95}N$ first cladding layer, a GaN active layer and an $Al_{0.05}Ga_{0.95}N$ second cladding layer will be described with reference to FIG. 6A. The second cladding layer 603 is actually an $Al_{0.1}Ga_{0.9}N$/GaN superlattice but may be effectively regarded as a bulk of $Al_{0.05}Ga_{0.95}N$, that is, an average composition of $Al_{0.1}Ga_{0.9}N$ and GaN.

When crystal is epitaxially grown on the (0001) plane corresponding to a Ga plane along the c-axis direction, spontaneous polarization 604 from the top surface toward the substrate is caused in both the $Al_{0.05}Ga_{0.95}N$ cladding layer and the GaN active layer, and the spontaneous polarization is smaller in the GaN active layer. Owing to this difference in the spontaneous polarization, polarization from the substrate toward the top surface is caused in the GaN active layer 602. Also, when the GaN substrate is used, tensile stress is caused in the $Al_{0.05}Ga_{0.95}N$ cladding layer, and piezoelectric polarization 605 from the top surface toward the substrate is caused. This piezoelectric polarization 605 ultimately causes polarization from the substrate toward the top surface in the GaN active layer 602. These polarizations are summed up, and hence, negative fixed sheet charge 606 is generated at the end of the GaN active layer 602 disposed on the side of the substrate (namely, on the right-hand side in the drawing) and positive fixed sheet charge 607 is generated at the end thereof disposed on the side of the top surface (namely, on the left-hand side in the drawing). Owing to an internal field formed by these fixed sheet charges, a conduction band 608 and a valence band 609 of the active layer 602 are inclined as shown in the drawing, and an inclined band gap 610 thus obtained is smaller than a primary field-free band gap 611. Also, holes 612 are localized at the end of the active layer 602 disposed on the side of the substrate and electrons 613 are localized at the end thereof disposed on the side of the top surface.

Next, novel finding concerned with the present invention will be described with reference to FIG. 6B. When an impurity element with higher electronegativity than nitrogen such as fluorine is introduced into the active layer 602 and the first and second cladding layers 601 and 603, a deep level working as an electron trap is formed. This electron trap captures an electron 613 present in the active layer 602 or newly generates a hole 612 so as to become negative fixed distributed charge 614. This negative fixed distributed charge causes an upward convex bent in the conduction band 608 and the balance band 609 of the active layer 602, resulting in a band structure as shown in FIG. 6B. A bent band gap 615 thus obtained is larger than the inclined band gap 610 and is closer to the field-free band gap 611.

The content of the impurity element necessary for substantially causing the bent of the band as shown in FIG. 6B is calculated as follows: The fixed sheet charge amount generated by the polarization on the interface between the GaN active layer and the $Al_{0.05}Ga_{0.95}N$ cladding layer is obtained as a sum of a difference in the spontaneous polarization between GaN and $Al_{0.05}Ga_{0.95}N$, namely, $2.8 \times 10^{-7}$ $C/cm^2$, and the piezoelectric polarization amount of $Al_{0.05}Ga_{0.95}N$ calculated based on a lattice constant, an elastic constant and a piezoelectric constant, that is, $1.23 \times 10^{-7}$ $C/cm^2$, and is approximately $4 \times 10^{-7}$ $C/cm^2$. When this charge amount is converted into the concentration of the impurity element distributed in a thickness of 100 nm of the active layer, $(4 \times 10^{-7}$ $C/cm^2) \div (1.6 \times 10^{-19}$ $C) \div (10 \times 10^{-7}$ $cm) = 2.5 \times 10^{17}$ $cm^{-3}$. Therefore, in order to substantially cause the bent of the band, the impurity element needs to be included in the concentration of this order. Therefore, in the bulk active layer of this embodiment, the operation and effect of this invention can be attained as far as the impurity element is included in a concentration of $10^{17}$ cm$^{-3}$ or more.

Embodiment 3

Figure 7:
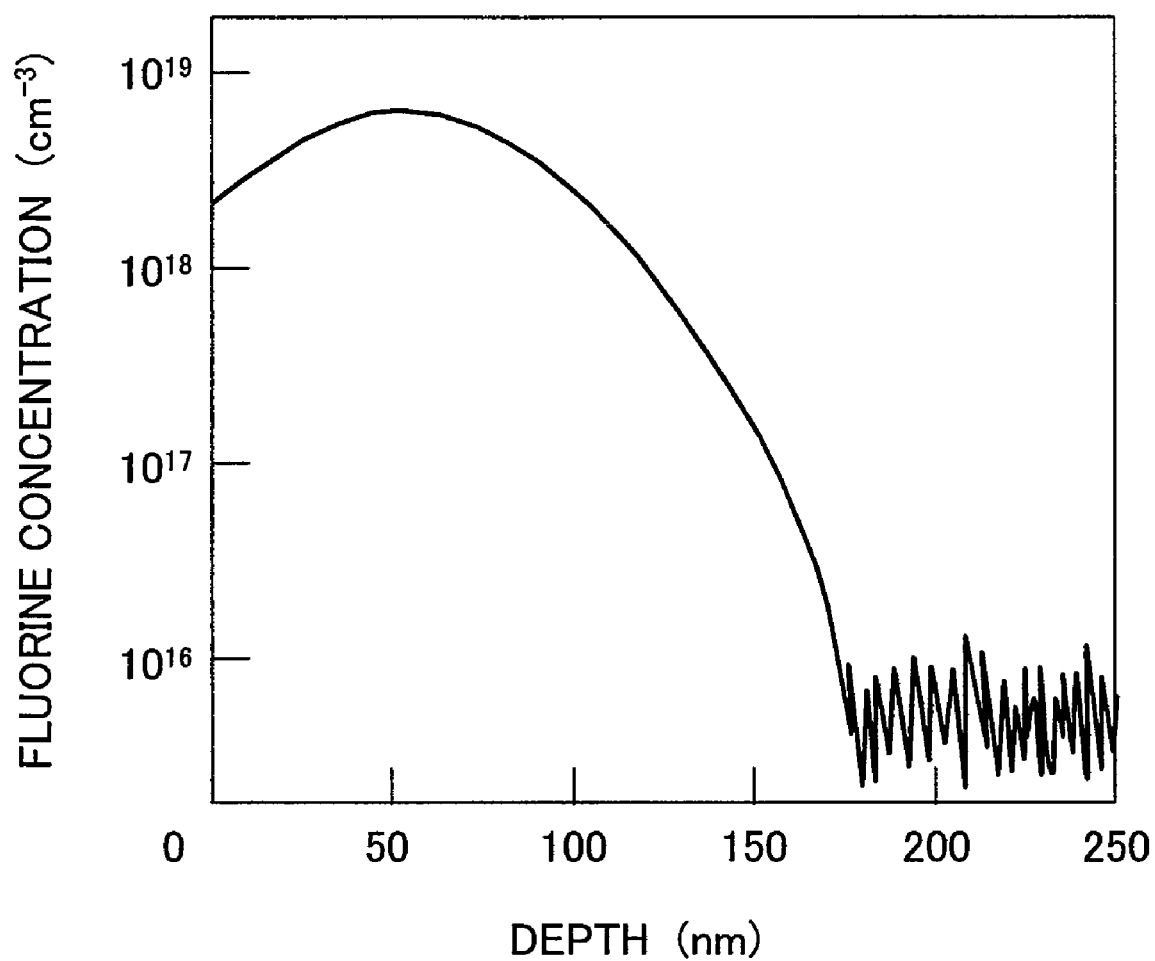
FIG. 7 is a distribution diagram along a depth direction of fluorine included in a window region of a semiconductor laser according to Embodiment 3 of the invention.

Embodiment 3 of the invention will now be described with reference to FIG. 7. This embodiment describes a fabrication method, in which the end face treatment is performed by a method other than the plasma processing, i.e., exposing an end face to plasma including an impurity element with higher electronegativity than nitrogen. Procedures other than the end face treatment are performed in the same manner as in Embodiment 1, and an impurity element with higher electronegativity than nitrogen such as fluorine is ion implanted through a resonator end face of a semiconductor laser having been processed into the shape of a bar having a resonator end face exposed through the cleavage. FIG. 7 corresponds to FIG. 2 mentioned in Embodiment 1 and shows the profile along the depth direction of the ion implanted fluorine. In this embodiment, the peak implantation amount is $6 \times 10^{18}$ cm$^{-3}$ and the implantation depth is 170 nm, and the implantation amount and the implantation depth of the ion implantation can be controlled to be predetermined values.

The ion implantation has a disadvantage of high cost as compared with the plasma processing but has an advantage that a larger amount of impurity element can be introduced into a deeper portion. Also, since it is apprehended that defects may be additionally caused in the resonator end face through the ion implantation, annealing is preferably performed after the implantation. For example, the defects caused by the ion implantation are annealed at 500° C. for 10 minutes with, for example, an RTA system.

Embodiment 4

Embodiment 4 of the invention will now be described with reference to FIG. 8. Also this embodiment describes a fabrication method, in which the end face treatment is performed by a method other than the plasma processing and the ion implantation.

Figure 8:
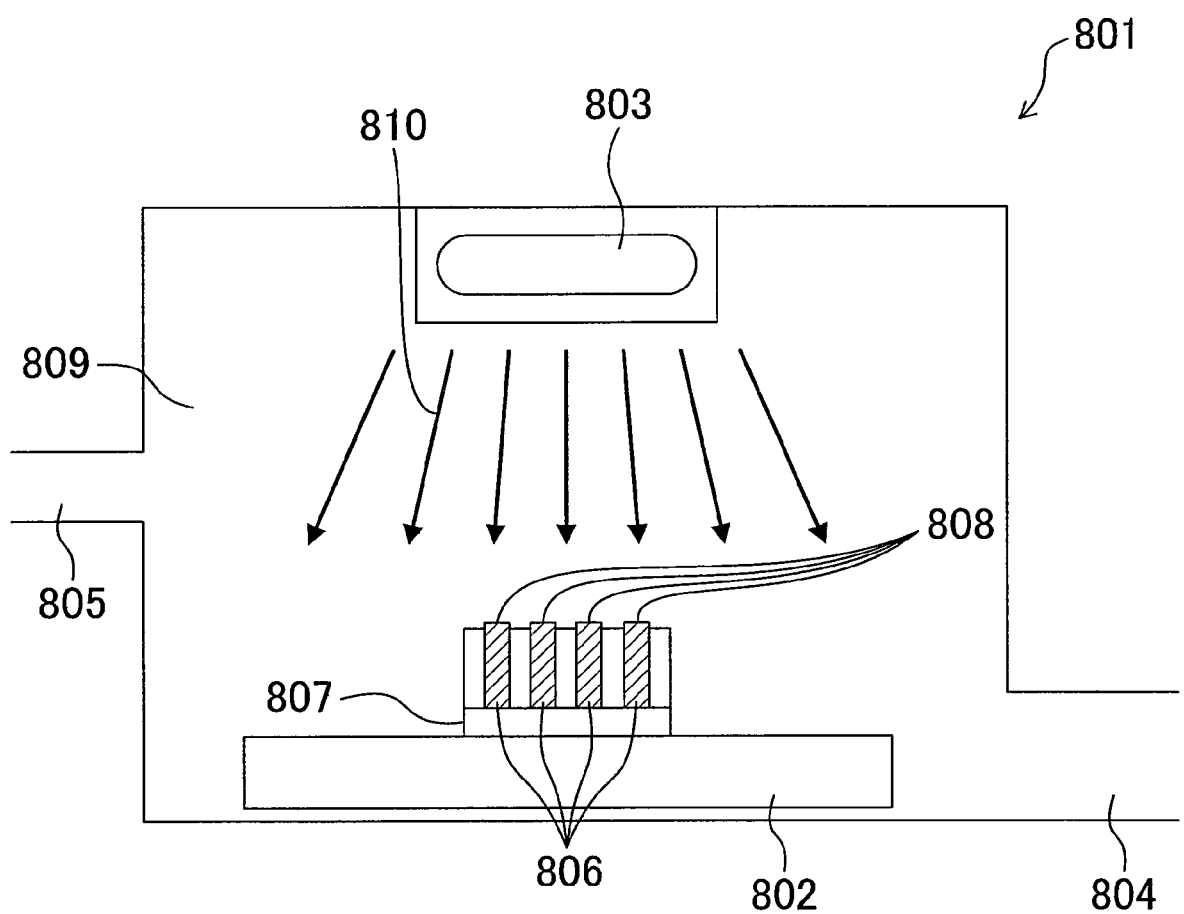
FIG. 8 is a conceptual diagram of an end face treatment performed in a method for fabricating a semiconductor laser according to Embodiment 4 or 5 of the invention.

The procedures other than the end face treatment are performed in the same manner as in Embodiment 1, and the semiconductor laser having been processed into the shape of a bar having a resonator end face exposed through the cleavage is set in a UV apparatus 801 shown in FIG. 8. The UV apparatus 801 includes a susceptor 802, a UV lamp 803, a vacuum exhausting line 804 and a gas introducing line 805. The bar 806 of the semiconductor laser is placed on the susceptor 802 and fixed with a supporting jig 807 with one end face 808 of the resonator facing upward. A chamber 809 of the UV apparatus 801 is once evacuated to attain high vacuum, a material gas is introduced through the gas introducing line 805, and a pressure within the chamber 809 is kept constant by adjusting the exhausting amount from the vacuum exhausting line 804. The material gas is a gas including an impurity element with higher electronegativity than nitrogen (such as fluorine) and is, for example, a carbon fluoride (CF$_4$) gas. After introducing the material gas, the UV lamp 803 is lighted for emitting UV 810. Thus, CF$_4$ present in the vicinity of the one end face 808 of the resonator is decomposed by the UV so as to form fluorine ions and/or radicals to be introduced through the one end face 808 of the resonator.

In this embodiment, the resonator end face is merely irradiated with the UV, and hence, the method of this embodiment has an advantage that the end face is minimally damaged as compared with the plasma processing and the ion implantation.

Embodiment 5

Embodiment 5 of the invention will now be described with reference to FIG. 8 again. This embodiment also describes a fabrication method, in which a resonator end face is heated, instead of being irradiated with UV, in an end face treatment similar to that of Embodiment 4. Specifically, the UV lamp 803 of the UV apparatus 801 of FIG. 8 is replaced with an infrared lamp, and the infrared lamp is lighted for heating a resonator end face after introducing a material gas. Thus, the material gas present in the vicinity of the one end face 808 of the resonator is thermally decomposed so as to form impurity ions and/or radicals to be introduced through the one end face 808 of the resonator. An electric heater buried in the susceptor 802 may be used instead of the infrared lamp so as to heat the bar 806 together with the supporting jig 807.

The material gas used in this embodiment is preferably easily thermally decomposed, and in the case where the impurity element is fluorine, xenon fluoride (XeF$_2$) or fluorine chloride (FCl$_3$) is preferably used.

Embodiment 6

Figure 9:
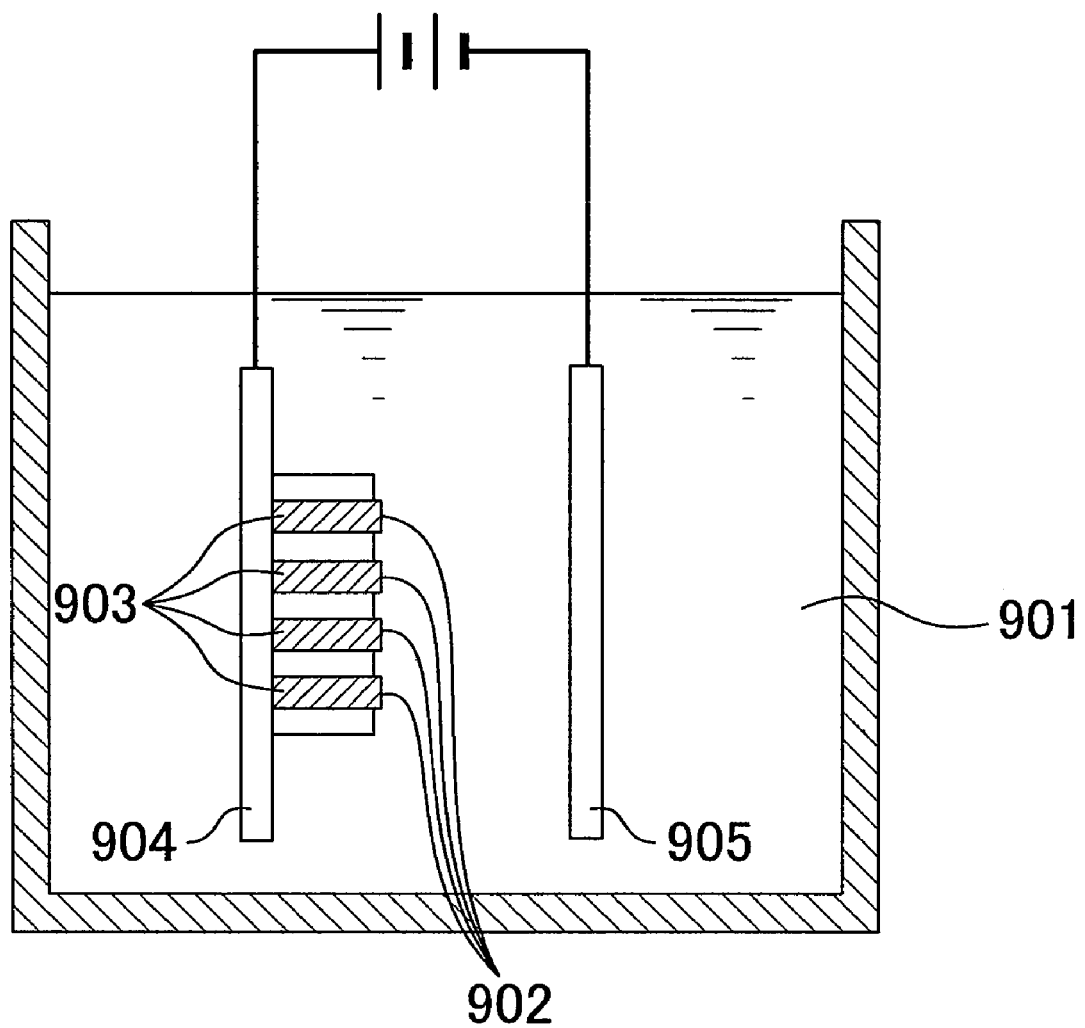
FIG. 9 is a conceptual diagram of an end face treatment performed in a method for fabricating a semiconductor laser according to Embodiment 6 of the invention.
Figure 10:
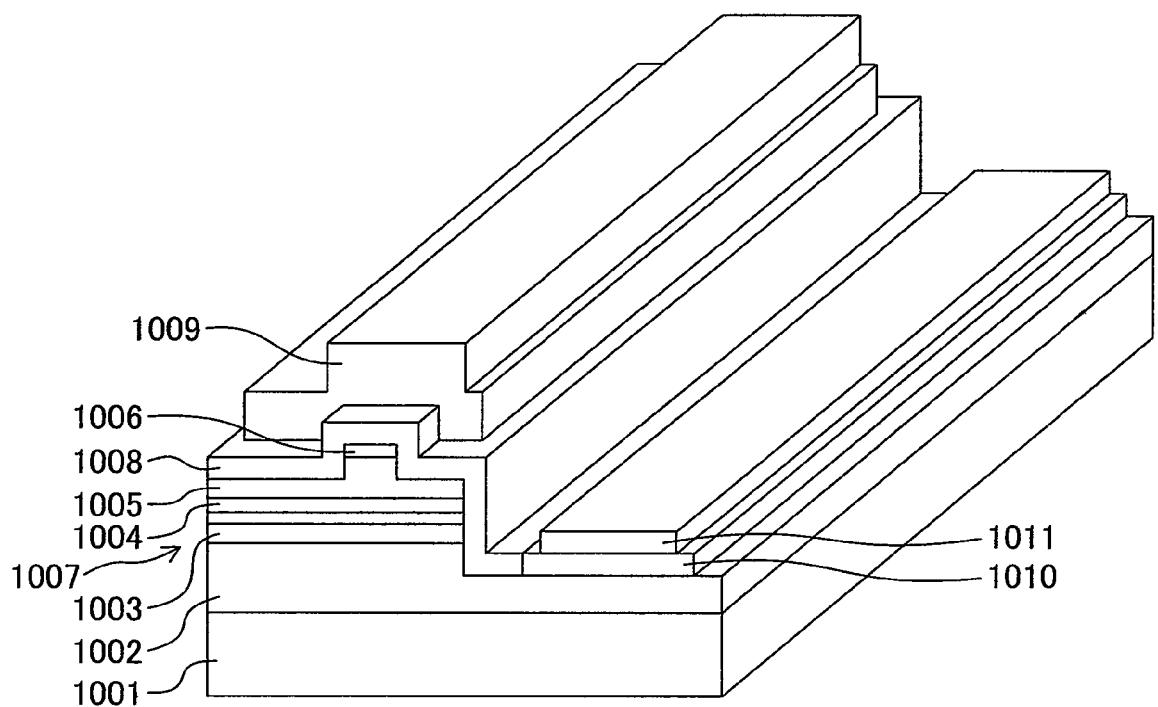
FIG. 10 is a perspective view of a conventional semiconductor laser.

Embodiment 6 of the invention will now be described with reference to FIG. 9. This embodiment also describes a fabrication method, in which the end face treatment is performed by wet processing. The procedures other than the end face treatment are performed in the same manner as in Embodiment 1. A bar 903 having a resonator end face 902 exposed through the cleavage is immersed in a solution including, in the form of ions, an impurity element with higher electronegativity than nitrogen, such as an ammonium fluoride (NH$_4$F) aqueous solution 901. Although fluorine ions (F$^-$) are incorporated through the resonator end face 902 merely by this immersion performed as the end face treatment, the effect can be further improved by applying an electric field. Specifically, a supporting jig 904 for supporting the bar 903 is made of a conducting material so that it can work as an anode, a cathode 905 is inserted into the NH$_4$F aqueous solution 901, and an electric field is applied between the anode and the cathode. Thus, the fluorine ions included in the solution are collected in the vicinity of the bar 903, so that a larger amount of fluorine ions can be incorporated through the resonator end face 902.

In this end face treatment performed as the wet processing, the fabrication cost is low because there is no need to use a vacuum system, and the resonator end face is never damaged as in the plasma processing or the ion implantation. However, since the semiconductor laser having been processed to the shape of a bar is put into the wet processing, it is necessary to be careful in handling the bar. Although it is difficult to unconditionally decide which is the best method among the plasma processing, the ion implantation, the UV irradiation, the heating and the wet processing, an impurity element with higher electronegativity than nitrogen can be introduced into a portion in the vicinity of a resonator end face by any of these methods, and all of them are effective as the end face treatment performed in the fabrication method of this invention.

INDUSTRIAL APPLICABILITY

In the nitride semiconductor laser of this invention, the COD is suppressed without lowering the yield or increasing the fabrication cost, or without affecting other electric/optical characteristics. Also, in the fabrication method for the nitride semiconductor laser, after exposing a resonator end face, the plasma processing, the ion implantation, the wet processing or the like, namely, processing generally employed in the semiconductor process, is merely additionally performed. The nitride semiconductor laser in which the COD is suppressed has both high optical output and high reliability and is useful industrially.

The invention claimed is:

1. A semiconductor laser comprising:
   a substrate;
   a first cladding layer made of a nitride semiconductor of a first conductivity type and formed on the substrate;
   an active layer made of a single-layered or multi-layered nitride semiconductor and formed on the first cladding layer;
   a second cladding layer made of a nitride semiconductor of a second conductivity type and formed on the active layer, and
   a passivation film made of a nitride insulator and formed on the end face,
   wherein an impurity element with higher electronegativity than nitrogen is included in at least one region that contains a portion of the active layer disposed in the vicinity of an end face along a resonator direction, and
   the impurity element is fluorine.

2. The semiconductor laser of claim 1,
   wherein the active layer has a multiple quantum well structure.

3. The semiconductor laser of claim 1,
   wherein a content of the fluorine is $10^{18}\,\mathrm{cm}^{-3}$ or more in the end face.

4. A method for fabricating a semiconductor laser comprising the steps of:
   forming, on a substrate, a first cladding layer made of a nitride semiconductor of a first conductivity type;
   forming, on the first cladding layer, an active layer made of a single-layered or multi-layered nitride semiconductor;
   forming, on the active layer, a second cladding layer made of a nitride semiconductor of a second conductivity type;
   exposing both end faces along a resonator direction by cleaving the substrate;
   performing an end face treatment for introducing an impurity element with higher electronegativity than nitrogen through at least one end face of the both end faces, and
   performing a passivation film depositing step continuously with the end face treatment in a vacuum system used in the end face treatment,
   wherein the impurity element is fluorine.

5. The method for fabricating a semiconductor laser of claim 4,
   wherein the both end faces or the one end face is exposed to plasma generated by using a material gas including the impurity element in the end face treatment.

6. The method for fabricating a semiconductor laser of claim 5,
   wherein the material gas includes, as a dominant component, one gas selected from the group consisting of fluorine, carbon fluoride, sulfur fluoride, nitrogen fluoride and silicon fluoride.

7. The method for fabricating a semiconductor laser of claim 4,
   wherein the impurity element is ion implanted into the both end faces or the one end face in the end face treatment.

8. The method for fabricating a semiconductor laser of claim 4,
   wherein the both end faces or the one end face is exposed to a material gas including the impurity element and the material gas is irradiated with UV in the end face treatment.

9. The method for fabricating a semiconductor laser of claim 4,
   wherein the both end faces or the one end face is exposed to a material gas including the impurity element and the material gas is heated in the end face treatment.

10. The method for fabricating a semiconductor laser of claim 9,
    wherein the material gas includes, as a dominant component, xenon fluoride or fluorine chloride.

11. The method for fabricating a semiconductor laser of claim 4,
    wherein the both end faces or the one end face is immersed in a solution including the impurity element in the form of ions in the end face treatment.

12. The method for fabricating a semiconductor laser of claim 11,
    wherein an electric field is applied to the solution with the both end faces or the one end face used as an anode in the end face treatment.

13. The method for fabricating a semiconductor laser of claim 11,
    wherein the solution is an ammonium fluoride aqueous solution.

* * * * *